(12) United States Patent
Mizuta

(10) Patent No.: US 10,472,732 B2
(45) Date of Patent: Nov. 12, 2019

(54) METHOD FOR MANUFACTURING SINGLE CRYSTAL

(71) Applicant: SUMCO CORPORATION, Tokyo (JP)

(72) Inventor: Masahiko Mizuta, Saga (JP)

(73) Assignee: SUMCO CORPORATION, Tokyo (JP)

( * ) Notice: Subject to any disclaimer, the term of this patent is extended or adjusted under 35 U.S.C. 154(b) by 341 days.

(21) Appl. No.: 14/870,547

(22) Filed: Sep. 30, 2015

(65) Prior Publication Data

US 2017/0088974 A1 Mar. 30, 2017

(51) Int. Cl.
*C30B 15/20* (2006.01)
*C30B 29/06* (2006.01)

(52) U.S. Cl.
CPC .............. *C30B 15/20* (2013.01); *C30B 29/06* (2013.01)

(58) Field of Classification Search
CPC .. C30B 15/20; C30B 29/06; G01N 2800/085; G01N 30/7233; G01N 33/487; G01N 33/88; G01N 33/92; G06F 19/18
See application file for complete search history.

(56) References Cited

U.S. PATENT DOCUMENTS

| 5,089,238 A | * | 2/1992 | Araki | ................. C30B 15/14 |
| | | | | 117/15 |
| 2009/0249995 A1 | * | 10/2009 | Takano | ................. C30B 15/14 |
| | | | | 117/15 |

FOREIGN PATENT DOCUMENTS

| JP | 2005-082474 | 3/2005 |
| JP | 2010-053015 | 3/2010 |
| JP | 2011207642 A | * 10/2011 |

* cited by examiner

*Primary Examiner* — Hua Qi
(74) *Attorney, Agent, or Firm* — Greenblum & Bernstein, P.L.C.

(57) ABSTRACT

A target value of a pull-up speed of the single crystal is set in advance before starting pulling-up of the single crystal for every predetermined pull-up length, the pull-up speed moving average value is calculated from actual values of the pull-up speeds measured from a time point that pulling-up of a predetermined length of the single crystal has been started until the current time point, a corrected value of the pull-up speed target value at a current time point is calculated and the single crystal is pulled up on the basis of this corrected value. When $\alpha$ is a past pull-up length and $\beta$ is a future pull-up length, a pull-up length ($\alpha+\beta$) used for calculating the corrected value of the pull-up speed target value is changed with an actual value of the single crystal diameter.

12 Claims, 6 Drawing Sheets

METHOD FOR MANUFACTURING SINGLE CRYSTAL

TECHNICAL FIELD

The present invention relates to a method of growing a single crystal such as a silicon single crystal and so forth from a raw material melt by a Czochralski method. Specifically, the present invention relates to a method of manufacturing a high quality single crystal which is reduced in crystal defects. More specifically, the present invention relates to a method of evaluating a moving average value of a pull-up speed to be required in order to obtain the single crystal of desired quality and having causal relationship with the quality of the single crystal and thereby correcting a target value of the pull-up speed.

BACKGROUND ART

In general, when manufacturing the silicon single crystal, a diameter of the single crystal is controlled by using the pull-up speed of the single crystal and a heater temperature as manipulated variables. For example, there is disclosed a method for manufacturing a silicon single crystal of growing the silicon single crystal by independently controlling an average pull-up speed and the heater temperature by using the Czochralski method (see, for example, Japanese Patent Application Laid-Open No. 2005-082474 (paragraphs [0011], [0012] and [0014])). In this method for manufacturing the silicon single crystal, a silicon single crystal growing length which is obtained per unit time of intervals of 30 min to 50 min while the silicon single crystal is being grown is defined as the average pull-up speed, and in a steady state, the average pull-up speed is fixed to a constant speed and in an unsteady state, the pull-up speed is fluctuated for a predetermined time in accordance with a deviation between an estimated crystal diameter and a target crystal diameter of the diameter of the crystal which is being grown, and in the steady state, the heater temperature is maintained constant and in the unsteady state, the heater temperature is fluctuated in accordance with the deviation between the estimated crystal diameter and the target crystal diameter of the diameter of the crystal which is being grown, and thereby the diameter of the single crystal is controlled. Here, the predetermined time for which the pull-up speed is fluctuated is a time which is shortened to such an extent (a fluctuation range is within ±0.02 mm/min) that no great influence is exerted onto the average pull-up speed which is fixed in the steady state and it is preferable that this time be not more than 30 seconds. By the method for manufacturing the silicon single crystal so configured, efficient pulling-up of the silicon single crystal which is reduced in crystal defects is attained On the other hand, there is disclosed a method for manufacturing a single crystal of controlling the pull-up speed moving average value which has a causal relationship with the quality of the single crystal (see, for example, Japanese Patent Application Laid-Open No. 2010-053015 (paragraphs [0007] to [0009], [0011] to [0013])). In this method for manufacturing the single crystal, the diameter of the single crystal is controlled by repetitively performing the step of calculating a set value of the single crystal pull-up speed, the step of calculating upper and lower limit values of the manipulated variable of the single crystal pull-up speed and the step of controlling the pull-up speed moving average value on the basis of the above-mentioned set value and the upper and lower limit values of the above-mentioned manipulated variable in a process of pulling up the single crystal by the Czochralski method. In addition, the upper and lower limit values of the manipulated variable of the pull-up speed are calculated such that the pull-up speed moving average value falls within a permissible range which has been set in advance, the diameter is controlled in that constraint condition and thereby also the pull-up speed moving average value is controlled so as to be within the permissible range which has been set in advance. Further, before starting pulling-up of the single crystal, the target value of the pull-up speed is set in advance for every pull-up length and the pull-up speed of the single crystal is corrected such that an actual measured value of the pull-up speed moving average value matches the target value.

In the method for manufacturing the single crystal so configured, the diameter of the single crystal is controlled by repetitively performing the step of calculating the set value of the single crystal pull-up speed and the upper and lower limit values of the manipulated variable of the pull-up speed and the step of controlling the pull-up speed moving average value of the single crystal on the basis of the above-mentioned set value and the above-mentioned upper and lower limit values of the manipulated variable of the pull-up speed. That is, since the pull-up speed moving average value of the single crystal is controlled every moment, quality dispersion in an axial direction of the single crystal is reduced. Consequently, the single crystal of high quality is stably manufactured. In addition, since the upper and lower limit values are calculated such that the pull-up speed moving average value falls within the permissible range, the quality dispersion in the axial direction of the single crystal is more reduced and the single crystal of high quality is manufactured more stably. Further, since the target value of the pull-up speed is set in advance before starting pulling-up of the single crystal and the pull-up speed of the single crystal is corrected such that the actual measured value of the moving average value of the pull-up speed matches the target value thereof, the pull-up speed of the single crystal is optimized, the quality diversion in the axial direction of the single crystal is more reduced and the single crystal of high quality is more stably manufactured.

SUMMARY OF THE INVENTION

However, in the method for manufacturing the silicon single crystal described in Japanese Patent Application Laid-Open No. 2005-082474, when a fluctuation range of the pull-up speed is small and an operation time is short, it is expected that so much influence is not exerted on the pull-up speed moving average value. However, when various unpredictable disturbances which are derived from a thermal ambience and so forth are generated in the diameter of the single crystal, there are cases where the fluctuation range of the pull-up speed is greatly reduced to ±0.02 mm/min or less and the required time is greatly reduced to 30 sec or less, and in this case, it is difficult to suppress the various disturbances to the diameter of the single crystal. In addition, also when the heater temperature is operated in order to suppress the disturbances to the diameter of the single crystal, since a time constant taken until the operation of the heater temperature influences the diameter of the single crystal is large, it is difficult to control the diameter of the single crystal. Even if the diameter of the single crystal was controlled by the above-mentioned method, it would be difficult to say that the pull-up speed moving average value does not greatly fluctuate because the manipulated variable of the pull-up speed is small and the pull-up speed moving average value would be left to take its own course. Therefore, it is difficult to control the diameter of the single crystal and to highly accurately control the moving average value of the pull-up speed so as to be within a range of, for example, ±1% or less by the silicon crystal manufacturing method described in Japanese Patent Application Laid-Open No. 2005-082474. On the other hand, in the method for manufacturing the single crystal shown in Japanese Patent Application Laid-Open No. 2010-053015, the high quality single crystal is manufactured stably by controlling the pull-up speed moving average value. However, when a large disturbance which would change the diameter of the single crystal has been generated, the controllability for the pull-up speed moving average value is reduced in some cases. Therefore, further improvement has been desired in order to improve the quality of the single crystal and to stably manufacture the single crystal.

The present invention has been made in view of the above mentioned circumstances and aims to provide a method for manufacturing the single crystal making it possible to manufacture a high-quality single crystal which is reduced in crystal defects by improving the controllability for the pull-up speed moving average value which has the causal relationship with the quality of the single crystal.

According to the first aspect of the present invention, there is provided a method for manufacturing a single crystal, including the steps of setting in advance a target value of a pull-up speed of a single crystal for every predetermined pull-up length before staring pulling-up of the single crystal by a Czochralski method, calculating a pull-up speed moving average value from actual values of the pull-up speeds measured from a time point that pulling-up of a predetermined length of the single crystal has been stated until a current time point while the single crystal is being pulled and in the middle of pulling-up of the predetermined length of the single crystal, calculating a corrected value of the target value of the pull-up speed at the current time point on the basis of the target value of the pull-up speed and the pull-up speed moving average value such that the pull-up speed moving average value matches the target value of the pull-up speed when there is a difference between the pull-up speed moving average value and the target value of the pull-up speed and pulling up the single crystal on the basis of the calculated corrected value of the target value of the pull-up speed, wherein when $\alpha$ is a past pull-up length which is a pull-up length used for calculating the actual value of the pull-up speed moving average value and $\beta$ is a future pull-up length, a pull-up length ($\alpha+\beta$) used for calculating the corrected value of the target value of the pull-up speed is changed in accordance with an actual value of a diameter of the single crystal.

The second aspect of the present invention is the invention of the first aspect, wherein a state of pulling up the single crystal is monitored, and when $|D_1-D_0|$ is not more than a threshold value $t_1$ where $D_0$ is a target value of the diameter of the single crystal and $D_1$ is the actual value of the diameter of the single crystal, the pull-up length ($\alpha+\beta$) used for calculating the corrected value of the target value of the pull-up speed is set shorter than a pull-up length $\gamma$ used for evaluating the pull-up speed moving average value, when $|D_1-D_0|$ is in excess of the threshold value $t_1$ and is not more than a threshold value $t_2$, the pull-up length ($\alpha+\beta$) used for calculating the corrected value of the target value of the pull-up speed is maintained at the pull length $\gamma$ used for evaluating the pull-up speed moving average value, and when $|D_1-D_0|$ is in excess of the threshold value $t_2$, the pull-up length ($\alpha+\beta$) used for calculating the corrected value of the target value of the pull-up speed is set longer than the pull-up length $\gamma$ used for evaluating the pull-up speed moving average value.

The third aspect of the present invention is the invention of the second aspect, wherein the threshold value $t_1$ and the threshold value $t_2$ are defined by evaluating past actual results of pulling up the single crystal.

The forth aspect of the present invention is the invention of the third aspect, wherein the threshold value $t_1$ and the threshold value $t_2$ are defined such that $t_1=0.5\times\sigma$ and $t_2=2\times\sigma$ when the past actual results of pulling up the single crystal have been evaluated and a dispersion $\sigma$ in diameter of the single crystal has been calculated.

The fifth to eighth aspects of the present invention are the invention of the first to fourth aspects, wherein the target value of the pull-up speed is set so as to be within a range from 0.3 mm/min to 1.2 mm/min.

The ninth to twelfth aspects of the present invention are the invention of the first to fourth aspects, wherein the single crystal pull-up length ($\alpha+\beta$) is set so as to be within a range from 30 mm to 70 mm.

According to the embodiment of the present invention, there is also provided the method for manufacturing the single crystal, wherein the past pull-up length $\alpha$ measured from the time point that pulling-up of the pull-up length ($\alpha+\beta$) of the single crystal has been started until the current time point is set so as to be within a range from 20% to 99% of the pull-up length ($\alpha+\beta$) and the future pull-up length $\beta$ is set so as to be within a range from 80% to 1% of the pull-up length ($\alpha+\beta$).

EFFECTS OF THE INVENTION

In the method for manufacturing the single crystal according to the first aspect of the present invention, the pull-up length ($\alpha+\beta$) used for calculating the corrected value of the target value of the pull-up speed is changed in accordance with the actual value of the diameter of the single crystal, and thereby the pull-up speed moving average value which is considerably related to and has the causal relationship with the quality of the single crystal is appropriately controlled and the single crystal is pulled up. That is, control of the pull-up speed and control of the diameter of the single crystal are not independent of each other and they influence each other. Thus, the pull-up length ($\alpha+\beta$) used for calculating the corrected value of the target value of the pull-up speed is made short or long on the basis of the actual value of the diameter of the single crystal while monitoring the diameter of the single crystal during growing of the single crystal, and thereby the corrected value of the target value of the pull-up speed is calculated every moment in accordance with the actual value of the pull-up speed moving average value and the single crystal is pulled up on the basis of the calculated corrected value. Consequently, it becomes possible to perform control of the pull-up speed and control of the diameter of the single crystal with high accuracy. The pull-up speed moving average value which greatly influences the quality of the single crystal is evaluated and the target value of the pull-up speed is corrected by taking the actual value of the diameter of the single crystal into consideration in this way. Thereby, the dispersion in quality of the single crystal is reduced, the dispersion in diameter of the single crystal is reduced and thus it becomes possible to stably manufacture the high-quality single crystal.

In the method for manufacturing the single crystal according to the second aspect of the present invention, when $|D_1-D_0|$ is not more than the threshold value $t_1$, that is, when controllability for the diameter of the single crystal is highly favorable, controllability for the pull-up speed moving average value is further improved by setting the pull-up length ($\alpha+\beta$) used for calculating the corrected value of the target value of the pull-up speed shorter than the pull-up length $\gamma$ used for evaluating the pull-up speed moving average value. In addition, when $|D_1-D_0|$ is in excess of the threshold value $t_1$ and is not more than a threshold value $t_2$, that is, when the controllability for the diameter of the single crystal is comparatively favorable, the pull-up length ($\alpha+\beta$) used for calculating the corrected value of the target value of the pull-up speed is maintained at the pull-up length $\gamma$ used for evaluating the pull-up speed moving average value, and thereby the controllability for the pull-up speed moving average value is maintained just as set. Further, when $|D_1-D_0|$ is in excess of the threshold value $t_2$, that is, when the controllability for the diameter of the single crystal has been slightly reduced, the pull-up length ($\alpha+\beta$) used for calculating the corrected value of the target value of the pull-up speed is set longer than the pull-up length $\gamma$ used for evaluating the pull-up speed moving average value for the purpose of improving the controllability for the diameter of the single crystal, and thereby the controllability for the pull-up speed moving average value is weakened. Consequently, it becomes possible to stably perform control of the diameter of the single crystal and control of the pull-up speed moving average value compatibly and it becomes possible to improve the controllability for the diameter of the single crystal at early stage.

DETAILED DESCRIPTION

Figure 1A:
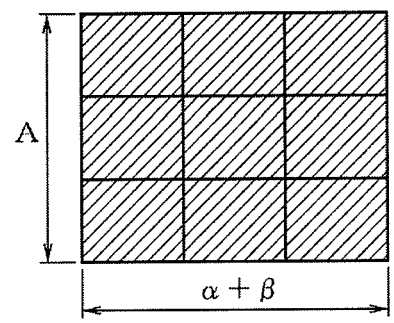
FIG. 1A is a conceptual diagram illustrating one example of a method of calculating a corrected value of a pull-up speed target value according to one embodiment of the present invention, that is, illustrating one example of a controlling method when the pull-up speed is as indicated by the target value.

Next, an embodiment of the present invention will be described on the basis of the drawings. In the embodiment, a silicon single crystal is pulled up from within a silicon melt contained in a crucible by the Czochralski method. Before pulling-up of the silicon single crystal is started, a pull-up speed target value is set in advance for every pull-up length. Then, a pull-up speed moving average value is calculated from actual values of the pull-up speeds measured from a time point that pulling-up of a predetermined pull-up length of the silicon single crystal is started until the current time point while the silicon single crystal is being pulled up and in the middle of pulling-up of the predetermined pull-up length of the silicon single crystal. Next, when there is a difference between the pull-up speed moving average value and the pull-up speed target value, a corrected value of the pull-up speed target value at the current time point is calculated on the basis of the pull-up speed target value and the pull-up speed moving average value such that the pull-up speed moving average value matches the pull-up speed target value. Further, the single crystal is pulled up on the basis of the calculated corrected value of the pull-up speed target value.

The pull-up speed target value is preferably set to be within a range from 0.3 mm/min to 1.2 mm/min. In addition, the predetermined pull-up length of the silicon single crystal is preferably set to be within a range from 30 mm to 70 mm and more preferably set to be within a range from 45 mm to 55 mm. Further, the pull-up length to be pulled up from the time point that pulling-up of the predetermined pull-up length of the silicon single crystal is started until the current time point is preferably set to be within a range from 20% to 99% of the predetermined pull-up length and more preferably set to be within a range from 80% to 99% of the predetermined pull-up length. The remaining pull-up length is preferably set to be within a range from 80% to 1% of the predetermined pull-up length and is more preferably set to be within a range from 20% to 1% of the predetermined pull-up length. The predetermined pull-up length of the silicon single crystal has been limited to be within the range from 30 mm to 70 mm for the reasons that although the predetermined pull-up length depends on the pulling-up device to be used in a strict sense, it is found from experimental results that the pull-up speed moving average value which is high in relativity with the quality of the silicon single crystal is the pull-up speed moving average value of 50 mm and it is preferable to set the pull-up speed moving average value so as not to be greatly different from 50 mm. Further, the pull-up length measured from the time point that pulling-up of the predetermined pull-up length of the silicon single crystal is started until the current time point has been limited to be within the range from 20% to 99% of the predetermined pull-up length and the remaining pull-up length has been limited to be within the range from 80% to 1% of the predetermined pull-up length for the reasons that when the pull-up length is less than 20% of the predetermined pull-up length and the remaining pull-up length is in excess of 80% of the predetermined pull-up length, constraint on the pull-up speed is considerably tightened.

Figure 1B:
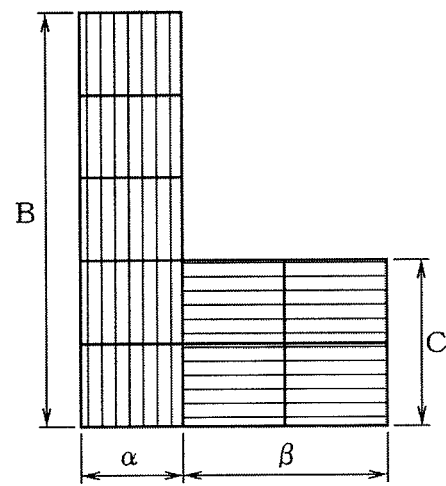
FIG. 1B is a conceptual diagram illustrating one example of a method of calculating a corrected value of a pull-up speed target value according to the embodiment of the present invention, that is, illustrating one example of a controlling method when the pull-up speed is higher than the target value.

FIG. 1A and FIG. 1B are schematic diagrams each illustrating one example of a method of calculating the pull-up speed moving average value. Specifically, FIG. 1A is the diagram illustrating one example of a rectangle in which the horizontal axis (i.e., the lateral length of the rectangle) indicates a pull-up length and the vertical axis (i.e., the longitudinal length of the rectangle) indicates a pull-up speed. FIG. 1A indicates that the average value of the pull-up speeds is A in a section of the pull-up length ($\alpha+\beta$). FIG. 1B is the diagram illustrating one example of a first rectangle in which the horizontal axis (i.e., the lateral length of the first rectangle) indicates a pull-up length α and the vertical axis (i.e. the longitudinal length of the first rectangle) indicates a pull-up speed B. FIG. 1B is the diagram also illustrating one example of a second rectangle in which the horizontal axis (i.e., the lateral length of the second rectangle) indicates a pull-up length β and the vertical axis (i.e., the longitudinal length of the second rectangle) indicates a pull-up speed C. Here, when a total area of the two first and second rectangles in FIG. 1B is the same as an area of the single rectangle in FIG. 1A, when once the pull-up speed B in the first rectangle is determined in FIG. 1B, it becomes possible to obtain the pull-up speed C in the second rectangle by using the following formulae (1) and (2). In FIG. 1B, according to one exemplary embodiment, the pull-up speed B in the first rectangle is the past pull-up speed moving average value, the pull-up speed C in the second rectangle is a pull-up speed moving average value to be set as a future target value, and it is indicated that it is possible to calculate the pull-up speed moving average value C to be set as the future target value by using information on α, β, A and B.

$$A \times (\alpha+\beta) = B \times \alpha + C \times \beta \qquad (1)$$

$$C = \{A \times (\alpha+\beta) - B \times \alpha\}/\beta \qquad (2)$$

Here, the left side of the formula (1) indicates an area of a diagonally hatched part in FIG. 1A and the right side of the formula (1) indicates a total area of a longitudinally hatched part and a laterally hatched part in FIG. 1B. Then, the formula (1) indicates that an integrated value in a section (α+β) (mm) used for calculating a corrected value of the pull-up speed target value is equal to a total value of an integrated value in a section α (mm) used for calculating an actual value of the pull-up speed moving average value and an integrated value in a future section β (mm) used for appropriately correcting the pull-up speed target value.

Therefore, it is possible to express the formula (1) as in the following formula (3) and to express the formula (2) as in the following formula (4).

$$\text{(Pull-up speed target value)} \times (\alpha+\beta) = \text{(actual value of pull-up speed moving average value)} \times \alpha + \text{(corrected value of pull-up speed target value)} \times \beta \qquad (3)$$

$$\text{(Corrected value of pull-up speed target value)} = \{\text{(pull-up speed target value)} \times (\alpha+\beta) - \text{(actual value of pull-up speed moving average value)} \times \alpha\}/\beta \qquad (4)$$

It is found from FIG. 1B that when the actual value of the pull-up speed moving average value is high, the pull-up speed target value is corrected to be rather lower.

Figure 2:
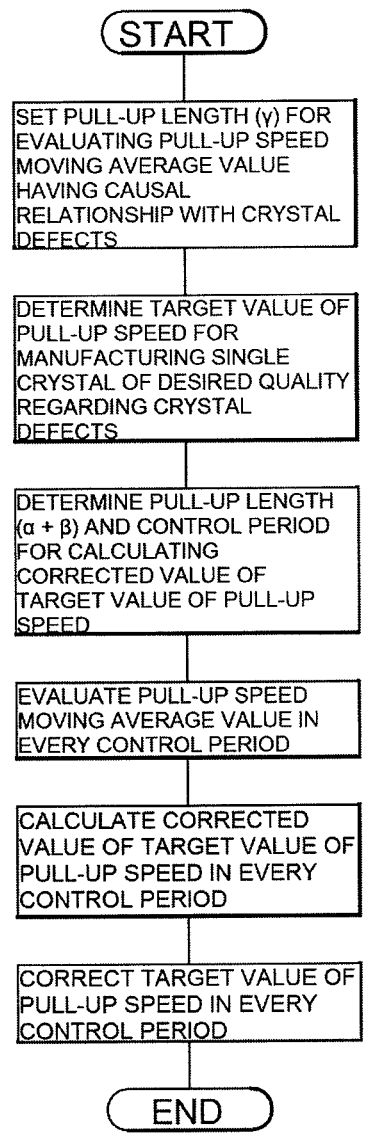
FIG. 2 is a flowchart illustrating one example of a flow for evaluating the pull-up speed moving average value.

Next, a controlling method for the pull-up speed moving average value will be described on the basis of a flowchart in FIG. 2. First, the pull-up length (γ) used for evaluating the pull-up speed moving average value which has a causal relationship with crystal defects is determined. It is possible to determine the pull-up length (γ) uniquely from the structure of the pulling-up device used. The reason therefor is that a concentration of point defects is determined on the basis of a range that the point defects which have been taken in when growing the single crystal diffuse and thereby the quality of a product (the pulled-up silicon single crystal) is determined. The range that the point defects diffuse is strongly correlated with the pull-up speed moving average value and therefore the quality of the product is also strongly correlated with the pull-up speed moving average value. However, that the quality of the product is correlated with how many mm of the pull-up speed moving average value in pull-up length depends on the pulling-up device used. In general, a slow cooling type pulling-up device has a longer pulling-up length than a quick cooling type pulling-up device used for evaluating the pull-up speed moving average value which is correlated with the crystal defects. Next, the target value of the pull-up speed used for manufacturing a silicon single crystal of desired quality is determined in regard to the crystal defects. Here, since the target value of the pull-up speed used for obtaining the silicon single crystal of desired quality is different depending on the pull-up length of the silicon single crystal, the pull-up speed target value is determined for every pull-up length of the silicon single crystal. Next, the pull-up length (α+β) and a control period used for calculating the corrected value of the pull-up speed target value are determined. Here, it is desirable that the control period be set so as to be the same as the control period of diameter control as long as it is avoided to set it greatly long. Further, the pull-up speed moving average value is evaluated in very control period, the corrected value of the pull-up speed target value is calculated on the basis of a result of evaluation, thereafter the pull-up speed target value is corrected and the silicon single crystal is pulled up on the basis of the corrected value of the pull-up speed target value. The pull-up speed moving average value is evaluated in every control period and the target value of the pull-up speed is corrected on the basis of this evaluation in this way, thereby the dispersion in quality of the silicon single crystal is reduced and it becomes possible to stably manufacture the silicon single crystal of high quality.

In setting the pull-up length (α+β)(mm) in order to calculate the corrected value of the pull-up speed target value, when α(mm) and β(mm) are set such that (α+β) (mm) is the same as γ(mm), it becomes possible to set the corrected value of the pull-up speed target value such that the actual value of the pull-up speed moving average value obtained when the silicon single crystal has been pulled up by γ(mm) matches the desired pull-up speed target value. For example, assuming that γ is 50 mm, when it is desired to match the actual value of the pull-up speed moving average value obtained when the silicon single crystal has been pulled up by 50 mm with a desired pull-up speed target value, α (mm) and β (mm) are set so as to meet the constraint of α+β=γ=50 (mm).

In addition, in pulling up the silicon single crystal, pulling-up of the silicon single crystal itself is not established unless the diameter of the silicon single crystal is controlled. Therefore, the controllability for the diameter of the silicon single crystal is important and it is desirable to perform control of the diameter of the silicon single crystal and control of the pull-up speed moving average value compatibly. Accordingly, in order to meet such a demand, the level of the controllability for the pull-up speed moving average value is adjusted with high accuracy while monitoring a pulled-up state of the silicon single crystal. That is, the pull-up length used for calculating the corrected value of the pull-up speed target value is changed in accordance with the actual value of the diameter of the silicon single crystal. Specifically, in a state of monitoring the pulled-up state of the silicon single crystal, assuming that the target value of the diameter of the silicon single crystal is $D_0$ and the actual value thereof is $D_1$, when $|D_1-D_0|$ is not more than the threshold value $t_1$, the pull-up length which has been controlled with the pull-up speed moving average value is set shorter than the predetermined pull-up length, when $|D_1-D_0|$ is in excess of the threshold value $t_1$ and is not more than the threshold value $t_2$, the pull-up length which has been controlled with the pull-up speed moving average value is maintained at the predetermined pull-up length, and further when $|D_1-D_0|$ is in excess of the threshold value $t_2$, the pull-up length which has been controlled with the pull-up speed moving average value is set longer than the predetermined pull-up length. Here, although the threshold value $t_1$ and the threshold value $t_2$ are set optionally, preferably, these threshold values are determined by evaluating the past pulling-up results of the silicon single crystal, and more preferably, it is possible to determine these threshold values such that $t_1=0.5\times\sigma$ and $t_2=2\times\sigma$ when the dispersion $\sigma$ in diameter of the single crystal has been calculated. That is, the dispersion $\sigma$ is a dispersion (a standard deviation) in diameter of the single crystal in the past pulling-up results and, for example, when $\sigma=0.8$ mm, $t_1=0.4$ mm and $t_2=1.6$ mm.

Figure 3:
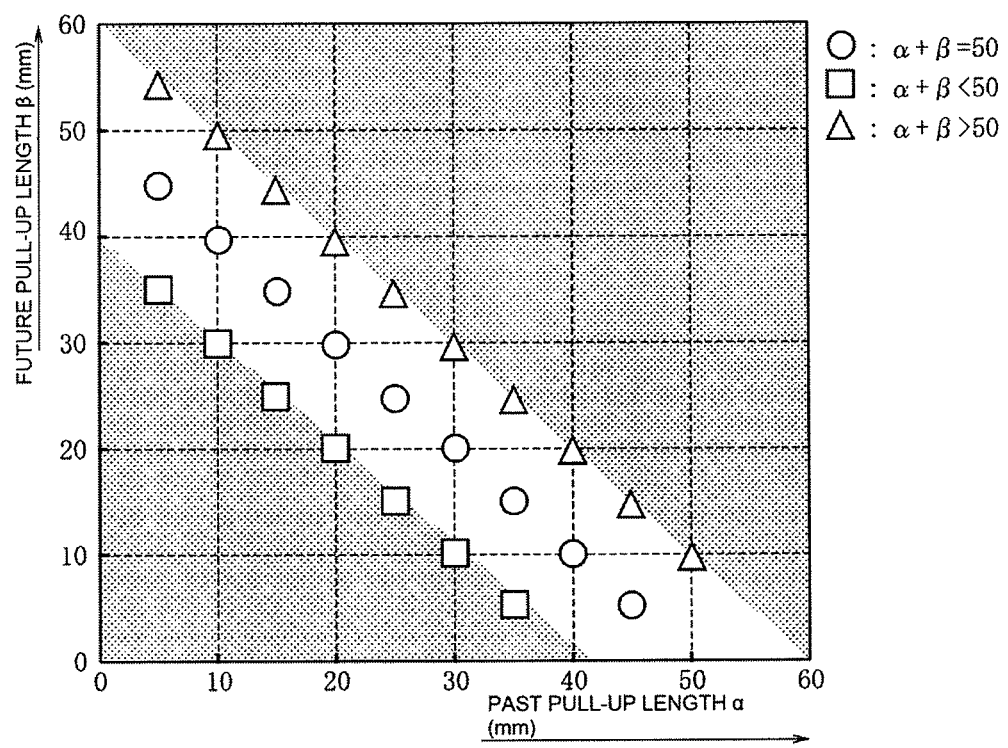
FIG. 3 is a diagram illustrating one example of a change in future pull-up length $\beta$ relative to a change in past pull-up length $\alpha$, illustrating the example that it is possible to enhance or weaken controllability for the pull-up speed moving average value in accordance with a value of a parameter.

When $|D_1-D_0|$ is not more than the threshold value $t_1$, it is possible to determine that the controllability for the diameter of the silicon single crystal is highly favorable, and in this case when the pull-up length which has been controlled with the pull-up speed moving average value is set shorter than the predetermined pull-up length as mentioned above, that is, when $\alpha$ and $\beta$ are set such that the pull-up length $(\alpha+\beta)$ used for calculating the corrected value of the pull-up speed target value meets a relation $(\alpha+\beta)<\gamma$, it becomes possible to improve the controllability for the pull-up speed moving average value. In addition, when $|D_1-D_0|$ is in excess of the threshold value $t_1$ and is not more than the threshold value $t_2$, it is possible to determine that the controllability for the diameter of the silicon single crystal is comparatively favorable. In this case, when the pull-up length which has been controlled with the pull-up speed moving average value is maintained at the predetermined pull-up length as mentioned above, that is, when $\alpha$ and $\beta$ are set such that the pull-up length $(\alpha+\beta)$ used for calculating the corrected value of the pull-up speed target value meets a relation $(\alpha+\beta)=\gamma$, it is possible to control the pull-up speed moving average value just as set. Further, when $|D_1-D_0|$ is in excess of the threshold value $t_2$, it is possible to determine that the controllability for the diameter of the silicon single crystal has been slightly reduced, and in this case, when the pull-up length which has been controlled with the pull-up speed moving average value is set longer than the predetermined pull-up length as mentioned above, that is, when $\alpha$ and $\beta$ are set such that the pull-up length $(\alpha+\beta)$ used for calculating the corrected value of the pull-up speed target value meets a relation $(\alpha+\beta)>\gamma$, it is possible to intentionally suppress the controllability for the pull-up speed moving average value. This is one measure taken in order to improve the controllability for the diameter of the silicon single crystal. It is possible to adjust the level of the controllability for the pull-up speed moving average value attained when the single crystal has been pulled up by, for example, 50 mm on the basis of data in FIG. 3. Here, the controllability for the pull-up speed moving average value is reduced in some cases in order to improve controllability for diameter control. That is, this is because although when the controllability for the pull-up speed moving average value is to be maintained, control that $\alpha$ and $\beta$ which meet a relational expression $(\alpha+\beta)=50$ (mm) have been set is performed and when the controllability for the pull-up speed moving average value is to be enhanced, control that $(\alpha+\beta)$ has been set smaller than 50 mm is performed, when the controllability for diameter control is to be improved, it is unavoidable to weaken the controllability for the pull-up speed moving average value by performing control that $(\alpha+\beta)$ has been set larger than 50 mm. A relation among these relational expressions is as illustrated in FIG. 3. In FIG. 3, "□" illustrates one example when the controllability for the pull-up speed moving average value is to be enhanced and "Δ" illustrates one example when the controllability for the pull-up speed moving average value is to be weakened. Consequently, it is possible to compatibly perform control of the diameter of the silicon single crystal and control of the pull-up speed moving average value more stably.

On the other hand, calculation of the corrected value of the pull-up speed target value may be performed in every control period and may be executed every hours corresponding to the integral multiple of the control period. It is possible to evaluate the moving average value of the pull-up speed by updating the pull-up speed target value in every period of calculating the corrected value of the pull-up speed target value and performing control of the diameter of the single crystal on the basis of the updated value. Specifically, when the control period has been set to ten seconds, the first step, that is, the step of calculating a corrected value $V_1$ of the pull-up speed target value on the basis of the formula (4) using the past pull-up length $\alpha$ and the future pull-up length $\beta$ which have been set, and the second step, that is, the step of pulling up the single crystal by using the corrected pull-up speed $V_1$ as the target value are repeated every ten seconds. In addition, since the single crystal is pulled up by 0.05 mm to 0.2 mm in ten seconds, the pull-up speed $V_1$ is updated every time the single crystal is pulled up by 0.05 mm to 0.2 mm. More specifically, a time point that the single crystal has been pulled up by 0.05 mm to 0.2 mm is set as the origin and correction (updating) of the pull-up speed target value is performed using the past pull-up length $\alpha$ and the future pull-up length $\beta$ which are counted from that time point. Further, ten seconds later, a time point that the single crystal has been pulled up by (0.05 mm to 0.2 mm)×2 mm is set as the origin and correction (updating) of the pull-up speed target value is performed using the past pull-up length $\alpha$ and the future pull-up length $\beta$ which are counted from that time point. Then, such operations are repetitively performed. In addition, when the pull-up speed moving average value has been made to match the target value of the pull-up speed which has been set before pulling up the single crystal, it is difficult to match these values perfectly because the pull-up speed is operated as the manipulated variable of diameter control. Thus, it is regarded that matching is established including that these values fall within a permissible range. The permissible range may be managed on the basis of, for example, management lower limit value and management upper limit value.

In addition, in order to hasten feedback to control of the pull-up speed moving average value, although in correction of the pull-up speed target value, it is profitable to reduce the pull-up length $\alpha$ used for calculating the actual value of the pull-up speed moving average value as much as possible, too much reduction of the pull-up length may possibly lead to a limitation on a future operating range of the pull-up speeds to weaken the controllability for the diameter. Here, the pull-up speed moving average value is an average value of the pull-up speeds measured when the single crystal has been pulled up by, for example, 50 mm. In addition, also when the dispersion in pull-up speed moving average value is large, it is favorable to set the pull-up length $\alpha$ long. Here, the pull-up length $\alpha$ is set, for example, to 40 mm. Further, when the dispersion in pull-up speed is small and relativity between the actual value of the pull-up speed moving average value and the pull-up speed moving average value which is high in relativity with the quality of the silicon single crystal is high, the controllability for the pull-up speed moving average value is improved by setting the pull-up length α short. Here, the pull-up speed α is set to, for example, 30 mm. That is, the pull-up length α may be set so as to make it possible to estimate the pull-up speed moving average value with high accuracy.

On the other hand, the pull-up length β is a value which is automatically determined from a and (α+β). In addition, the pull-up length β is a factor adjustment of which may be performed by taking much time or in a short period of time. When the controllability for the pull-up speed moving average value is low, sudden correction of the pull-up length β may probably induce a disturbance and therefore it is favorable to adjust the pull-up length β by taking much time. In this case, the pull-up length β is set long. Here, the pull-up length β is set to, for example, 40 mm. In addition, when the controllability for the pull-up speed moving average value is high, the pull-up length β may be adjusted in the short period of time. In this case, the pull-up length β is set short. Here, the pull-up length β is set to, for example, 10 mm. Further, the control period may be set at time intervals of, for example, ten seconds or hours corresponding to the integral multiple of ten seconds. Incidentally, setting of (α+β) may be performed manually or automatically. In addition, α and β may be set in advance for every pull-up length or may be changed manually or automatically every moment while the single crystal is being pulled up.

Incidentally, although in the above mentioned embodiment, the silicon single crystal has been given as an example of the single crystal, the present invention is not limited to the silicon single crystal.

EXAMPLES

Next, examples of the present invention will be described in detail together with a comparative example.

Example 1

A silicon single crystal to be used for a semiconductor wafer having a diameter of 300 mm was pulled up from within a silicon melt contained in a crucible by the Czochralski method. Then, control was performed as follows within a range from 800 mm to 1400 mm in pull-up length. First, the pull-up speed target value was set for every pull-up length such that the silicon single crystal of desired quality is obtained. Next, the pull-up length (α+β) used for calculating the corrected value of the pull-up speed target value which is high in relativity with the quality of the silicon single crystal was set to 50 mm. Then, for the purpose of positively controlling the pull-up speed moving average value, basically, the control period was set to 10 seconds with α=10 mm and β=40 mm. The actual value of the pull-up speed moving average value when the single crystal was pulled up by 10 mm was calculated in every control period and the corrected value of the pull-up speed target value was calculated on the basis of the following formula (4) and pulling-up of the single crystal which is based on the corrected value of the pull-up speed target value was continuously performed.

(Corrected value of pull-up speed target value)={
(pull-up speed target value)×(α+β)−(actual
value of pull-up speed moving average value)×
α}/β     (4)

However, since within a range from 900 mm to 1100 mm in pull-up length, the controllability for the diameter of the silicon single crystal is favorable, the pull-up length (α+β) used for calculating the corrected value of the pull-up speed target value was set to 45 mm, a was set to 10 mm and β was set to 35 mm for the purpose of enhancing the controllability for the pull-up speed moving average value. In addition, within a range from 1100 mm to 1200 mm in pull-up length, the controllability for the diameter of the silicon single crystal was slightly lowered in comparison with that in case of the range from 900 mm to 1100 mm in pull-up length, the pull-up length (α+β) used for calculating the corrected value of the pull-up speed target value was set to 55 mm, a was set to 10 mm and β was set to 45 mm for the purpose of weakening controllability for the actual value of the pull-up speed moving average value, by attaching importance on the controllability for the diameter of the silicon single crystal.

<Test 1 and Evaluation>

Figure 4:
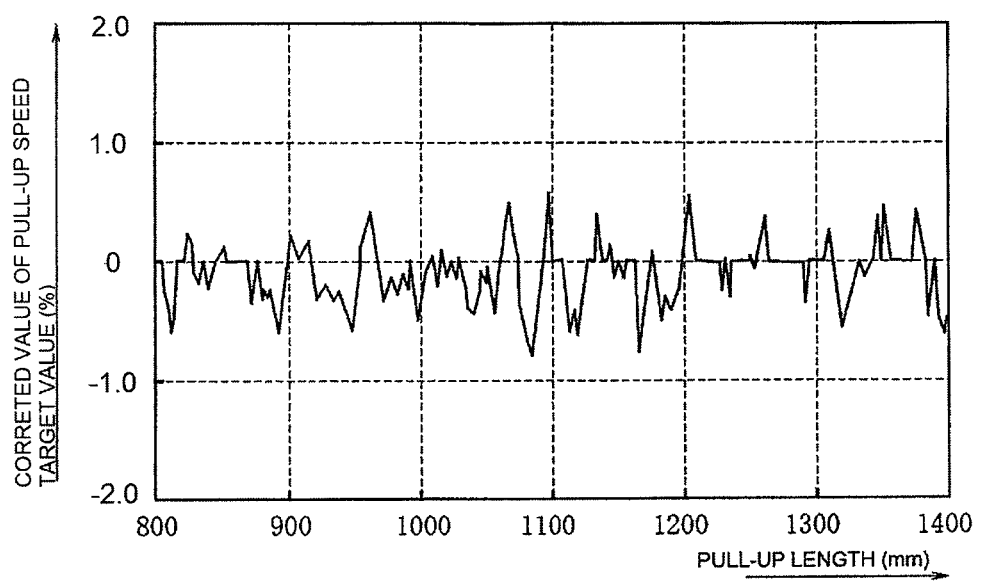
FIG. 4 is a diagram illustrating one example of a result of calculation of a change in corrected value of the pull-up speed target value relative to a change in pull-up length.
Figure 5:
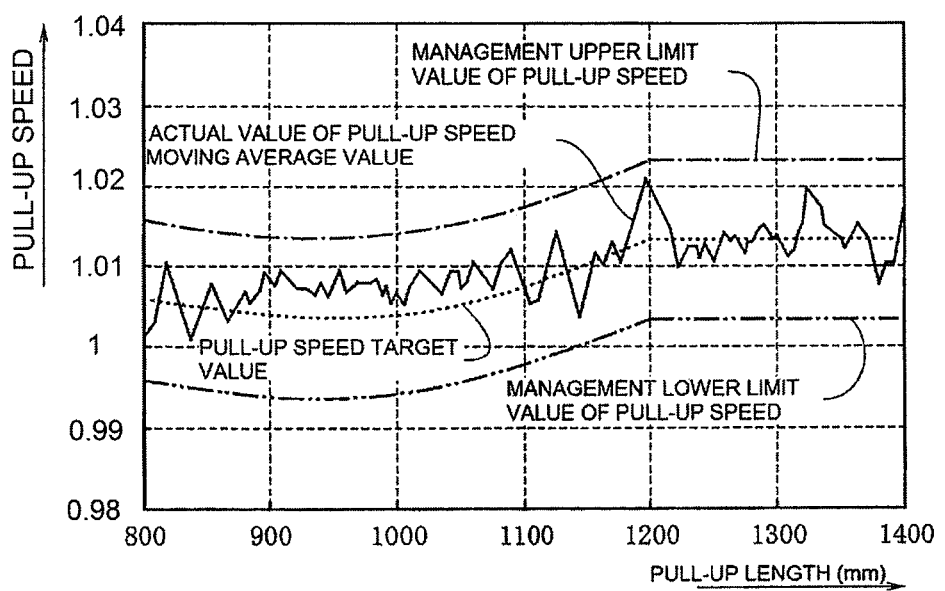
FIG. 5 is a diagram illustrating one example of a change in pull-up speed relative to the change in pull-up length, that is, illustrating one example of the controllability for the pull-up speed moving average value.
Figure 6:
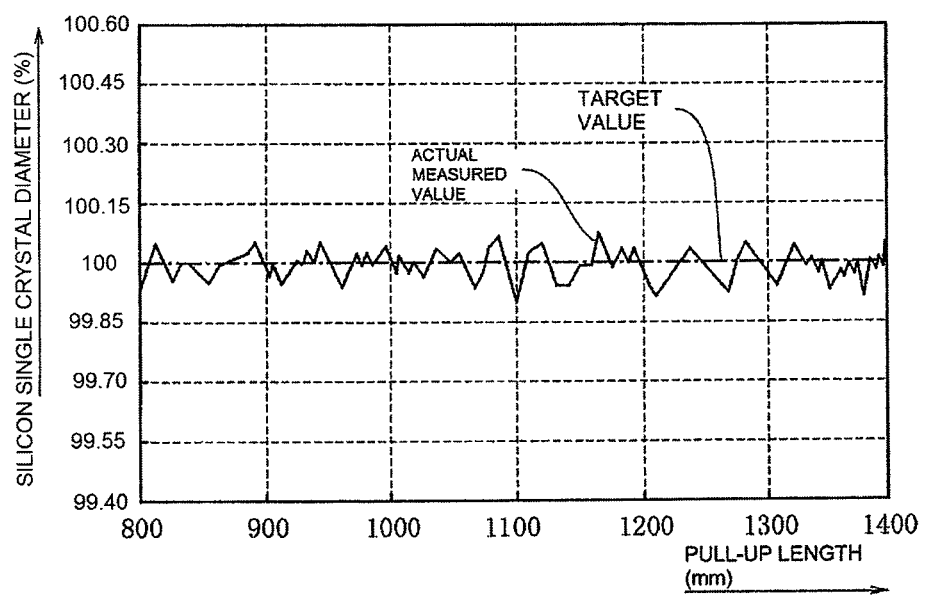
FIG. 6 is a diagram illustrating one example of a change in diameter of the single crystal relative to a change in pull-up length, that is, illustrating one example of controllability for the diameter.

A change in corrected value of the pull-up speed target value within the range from 800 mm to 1400 mm in pull-up length in Example 1 is shown in FIG. 4. In FIG. 4, the value when the pull-up speed target value is not corrected is set to be "0%." In addition, a change in pull-up speed moving average value within the range from 800 mm to 1400 mm in pull-up length in Example 1 is shown in FIG. 5. In FIG. 5, the pull-up seed target value is set to be "1" in an arbitrary unit. Further, the controllability for the diameter of the silicon single crystal when control of the pull-up speed moving average value in Example 1 was performed is shown in FIG. 6. In FIG. 6, the target value of the diameter of the silicon single crystal is set to be "100%."

As apparent from FIG. 4, it became possible to control the corrected value of the pull-up speed target value so as to be within a range from +0.6% to −0.8% for the pull-up speed target value. In addition, as apparent from FIG. 5, it became possible to control the actual value of the pull-up speed moving average value so as to be within a range of ±1.0% of the pull-up speed target value. In addition, as apparent from FIG. 5, it became possible to roughly control the actual value of the pull-up speed moving average so as to be within a range of ±0.5% of the pull-up speed target value within the range from 900 mm to 1100 mm in pull-up length. Further, as apparent from FIG. 6, it became possible to control the diameter of the silicon single crystal so as to be within a range from 99.90% to 100.10%, that is, within a range of ±0.10% for the target value of 100%. Considering from these results, it was found that it became possible to favorably control the pull-up speed moving average value and the diameter of the silicon single crystal.

Example 2

The pull-up length used for calculating the corrected value of the pull-up speed target value is a value which is determined from the relativity between the pull-up speed moving average value and the quality of the silicon single crystal. The corrected value of the pull-up speed target value when the silicon single crystal was pulled up by setting this value to 50 mm was obtained. Specifically, the corrected value of the pull-up speed target value was calculated by substituting the pull-up speed target value, the actual value of the pull-up speed moving average value, the past pull-up length α (the pull-up length used for calculating the actual value of the pull-up speed moving average value) and the future pull-up length β into the following formula (4)

(Corrected value of pull-up speed target value)={
(pull-up speed target value)×(α+β)−(actual
value of pull-up speed moving average value)×
α}/β     (4)

<Test 2 and Evaluation>

A result of the calculation is shown in Table 1. Incidentally, in Table 1, the pull-up speed target value, the actual value of the pull-up speed moving average value, the past pull-up length α and the future pull-up length β are listed together with the corrected value of the pull-up speed target value.

TABLE 1

| Pull-up speed target value (mm/min) | Actual value of pull-up speed moving average value (mm/min) | Past pull-up length α (mm) | Future pull-up length β (mm) | Corrected value of pull-up speed target value × (mm/min) |
|---|---|---|---|---|
| 1 | 0.50 | 0.52 | 40 | 10 | 0.420 |
| 2 | 0.50 | 0.52 | 30 | 20 | 0.470 |
| 3 | 0.50 | 0.52 | 20 | 30 | 0.487 |
| 4 | 0.50 | 0.52 | 10 | 40 | 0.495 |
| 5 | 0.50 | 0.52 | 40 | 5 | 0.340 |
| 6 | 0.50 | 0.52 | 30 | 15 | 0.460 |
| 7 | 0.50 | 0.52 | 20 | 25 | 0.484 |
| 8 | 0.50 | 0.52 | 10 | 35 | 0.494 |
| 9 | 0.50 | 0.52 | 40 | 15 | 0.447 |
| 10 | 0.50 | 0.52 | 30 | 25 | 0.476 |
| 11 | 0.50 | 0.52 | 20 | 35 | 0.489 |
| 12 | 0.50 | 0.52 | 10 | 45 | 0.496 |

Table 1 shows that since it is unavoidable to put the pull-up speed into the predetermined range of the pull-up speed target value with a shorter pull-up length as the future pull-up length β becomes shorter, it becomes unavoidable to add considerable correction to the pull-up speed target value which has been set before pulling-up of the single crystal. It was found that since when a difference between these values is too large, there is the possibility that the controllability for the diameter of the silicon single crystal may be reduced, it is important not to make the future pull-up length β too short in order to control the pull-up speed moving average value while controlling the diameter of the silicon single crystal.

The invention claimed is:

1. A method for manufacturing a single crystal, comprising:
setting in advance, for each of a plurality of pull-up lengths, a target value of a pull-up speed of the single crystal, wherein the setting is performed before starting pulling-up of the single crystal by a Czochralski method;
calculating a pull-up speed moving average value from a plurality of actual values of pull-up speeds measured from a starting time point that pulling-up of a predetermined length of the single crystal has been started until a current time point while the single crystal is being pulled up;
calculating, at the current time point, a corrected value of the target value of the pull-up speed based on the target value of the pull-up speed at the current time for a corresponding pull-up length and the pull-up speed moving average value as of the current time, such that the pull-up speed moving average value matches the target value of the pull-up speed when there is a difference between the pull-up speed moving average value and the target value of the pull-up speed;
achieving the target value of the pull-up speed at the current time point by continuously and repeatedly conducting a correction of a target value of a pull-up speed from the starting time point until the current time point;
pulling up the single crystal based on the calculated corrected value of the target value of the pull-up speed at the current time point,
wherein
when α is a past pull-up length for calculating an actual value of the pull-up speed moving average value and β is a future pull-up length,
a corrective pull-up length (α+β) used for calculating the corrected value of the target value of the pull-up speed is changed in accordance with an actual value of the diameter of the single crystal,
wherein the past pull-up length is a pull-up length relating to the single crystal at a past time point that is earlier than the current time point, and the future pull-up length is a pull-up length relating to the same single crystal at a future time point that is later than the current time point, and
wherein
a state of pulling up the single crystal is monitored, and when $|D_1-D_0|$ is not more than a threshold value $t_1$ where $D_0$ is a target value of the diameter of the single crystal and $D_1$ is the actual value of the diameter of the single crystal, the corrective pull-up length (α+β) used for calculating the corrected value of the target value of the pull-up speed is set to be shorter than a reference pull-up length γ used for evaluating the pull-up speed moving average value,
when $|D_1-D_0|$ is greater than the threshold value $t_1$ and is not more than a threshold value $t_2$, the corrective pull-up length (α+β) used for calculating the corrected value of the target value of the pull-up speed is set to be maintained at the reference pull-up length γ used for evaluating the pull-up speed moving average value, and
when $|D_1-D_0|$ is greater than the threshold value $t_2$, the corrective pull-up length (α+β) used for calculating the corrected value of the target value of the pull-up speed is set to be longer than the reference pull-up length γ used for evaluating the pull-up speed moving average value.

2. The method for manufacturing the single crystal according to claim 1, wherein
the threshold value $t_1$ and the threshold value $t_2$ are defined by evaluating past actual results of pulling up the single crystal.

3. The method for manufacturing the single crystal according to claim 2, wherein
the threshold value $t_1$ and the threshold value $t_2$ are defined such that $t_1=0.5\times\sigma$ and $t_2=2\times\sigma$ when the past actual results of pulling up the single crystal have been evaluated and a dispersion σ in diameter of the single crystal has been calculated.

4. The method for manufacturing the single crystal according to claim 2, wherein
the target value of the pull-up speed is set so as to be within a range from 0.3 mm/min to 1.2 mm/min.

5. The method for manufacturing the single crystal according to claim 2, wherein
the corrective pull-up length (α+β) is a single crystal pull-up length that is set to be within a range from 30 mm to 70 mm.

6. The method for manufacturing the single crystal according to claim 2, wherein
the past pull-up length α measured from the time point that pulling-up of the corrective pull-up length (α+β) of the single crystal has been started until the current time point is set to be within a range from 20% to 99% of the corrective pull-up length (α+β), and the future pull-up length $\beta$ is set to be within a range from 80% to 1% of the corrective pull-up length ($\alpha+\beta$).

7. The method for manufacturing the single crystal according to claim 3, wherein
the target value of the pull-up speed is set so as to be within a range from 0.3 mm/min to 1.2 mm/min.

8. The method for manufacturing the single crystal according to claim 3, wherein
the corrective pull-up length ($\alpha+\beta$) is a single crystal pull-up length that is set to be within a range from 30 mm to 70 mm.

9. The method for manufacturing the single crystal according to claim 3, wherein
the past pull-up length $\alpha$ measured from the time point that pulling-up of the corrective pull-up length ($\alpha+\beta$) of the single crystal has been started until the current time point is set to be within a range from 20% to 99% of the corrective pull-up length ($\alpha+\beta$), and
the future pull-up length $\beta$ is set to be within a range from 80% to 1% of the corrective pull-up length ($\alpha+\beta$).

10. The method for manufacturing the single crystal according to claim 1, wherein
the target value of the pull-up speed is set so as to be within a range from 0.3 mm/min to 1.2 mm/min.

11. The method for manufacturing the single crystal according to claim 1, wherein
the corrective pull-up length ($\alpha+\beta$) is a single crystal pull-up length that is set to be within a range from 30 mm to 70 mm.

12. The method for manufacturing the single crystal according to claim 1, wherein
the past pull-up length $\alpha$ measured from the time point that pulling-up of the corrective pull-up length ($\alpha+\beta$) of the single crystal has been started until the current time point is set to be within a range from 20% to 99% of the corrective pull-up length ($\alpha+\beta$), and
the future pull-up length $\beta$ is set to be within a range from 80% to 1% of the corrective pull-up length ($\alpha+\beta$).

* * * * *